United States Patent
Ko et al.

(10) Patent No.: US 7,319,075 B2
(45) Date of Patent: Jan. 15, 2008

(54) ETCHANT WITH SELECTIVITY FOR DOPED SILICON DIOXIDE OVER UNDOPED SILICON DIOXIDE AND SILICON NITRIDE, PROCESSES WHICH EMPLOY THE ETCHANT, AND STRUCTURES FORMED THEREBY

(75) Inventors: Kei-Yu Ko, Meridian, ID (US); Li Li, Meridian, ID (US); Guy T. Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 214 days.

(21) Appl. No.: 10/396,164

(22) Filed: Mar. 25, 2003

(65) Prior Publication Data
US 2003/0203639 A1 Oct. 30, 2003

Related U.S. Application Data

(63) Continuation of application No. 09/625,144, filed on Jul. 25, 2000, now Pat. No. 6,537,922, which is a continuation of application No. 09/102,152, filed on Jun. 22, 1998, now Pat. No. 6,117,791.

(51) Int. Cl.
*H01L 21/302* (2006.01)
(52) U.S. Cl. ........................ 438/723; 438/714
(58) Field of Classification Search ................ 438/723, 438/724, 740, 706, 710, 712, 714
See application file for complete search history.

(56) References Cited

U.S. PATENT DOCUMENTS

| | | | |
|---|---|---|---|
| 3,886,569 A | 5/1975 | Basi et al. | |
| 4,529,476 A | 7/1985 | Kawamoto et al. | |
| 4,806,199 A | 2/1989 | Gualandris | |
| 4,807,016 A | 2/1989 | Douglas | |
| 5,202,849 A | 4/1993 | Nozaki | |
| 5,275,972 A | 1/1994 | Ogawa et al. | |
| 5,286,344 A | 2/1994 | Blalock et al. | |
| 5,300,463 A | 4/1994 | Cathey et al. | |

(Continued)

FOREIGN PATENT DOCUMENTS

EP 0721205 A2 7/1996

(Continued)

OTHER PUBLICATIONS

Wolf, S., et al., Silicon Processing for the VLSI Era, vol. 1, Process Technology, Lattice Press, 1986, pp. 520-523.

(Continued)

*Primary Examiner*—Kin-Chan Chen
(74) *Attorney, Agent, or Firm*—TraskBritt

(57) ABSTRACT

A selective dry etch process includes use of an etchant that includes $C_2H_xF_y$, where x is an integer from three to five, inclusive, where y is an integer from one to three, inclusive, and where x plus y equals six. The etchant etches doped silicon dioxide with selectivity over both undoped silicon dioxide and silicon nitride. Thus, undoped silicon dioxide and silicon nitride may be employed as etch stops in dry etch processes which utilize the $C_2H_xF_y$-containing etchant. $C_2H_xF_y$ may be employed as either a primary etchant or as an additive to another etchant or etchant mixture.

13 Claims, 2 Drawing Sheets

U.S. PATENT DOCUMENTS

| | | |
|---|---|---|
| 5,424,570 A | 6/1995 | Sardella et al. |
| 5,428,240 A | 6/1995 | Lur |
| 5,468,342 A | 11/1995 | Nulty et al. |
| 5,562,801 A | 10/1996 | Nulty |
| 5,626,716 A | 5/1997 | Bosch et al. |
| 5,648,175 A | 7/1997 | Russell et al. |
| 5,695,658 A | 12/1997 | Alwan |
| 5,759,888 A | 6/1998 | Wang et al. |
| 5,814,563 A | 9/1998 | Ding et al. |
| 5,817,580 A | 10/1998 | Violette |
| 5,828,096 A | 10/1998 | Ohno et al. |
| 5,831,899 A | 11/1998 | Wang et al. |
| 5,841,195 A | 11/1998 | Lin et al. |
| 5,843,845 A | 12/1998 | Chung |
| 5,843,847 A * | 12/1998 | Pu et al. ................ 438/723 |
| 5,855,962 A | 1/1999 | Cote et al. |
| 5,948,701 A | 9/1999 | Chooi et al. |
| 5,965,035 A | 10/1999 | Hung et al. |
| 6,018,184 A | 1/2000 | Becker |
| 6,051,870 A | 4/2000 | Ngo |
| 6,066,555 A | 5/2000 | Nulty et al. |
| 6,077,742 A | 6/2000 | Chen et al. |
| 6,077,743 A | 6/2000 | Chen |
| 6,110,831 A | 8/2000 | Cargo et al. |
| 6,117,791 A | 9/2000 | Ko et al. |
| 6,121,671 A | 9/2000 | Ko et al. |
| 6,239,017 B1 | 5/2001 | Lou et al. |
| 6,277,720 B1 | 8/2001 | Doshi et al. |
| 6,303,496 B1 | 10/2001 | Yu |
| 6,483,172 B1 | 11/2002 | Cote et al. |

FOREIGN PATENT DOCUMENTS

| | | |
|---|---|---|
| JP | 61251138 | 8/1986 |
| JP | 06120174 | 4/1994 |
| JP | 07-161702 | 6/1995 |
| JP | 09-027483 | 1/1997 |
| JP | 10022385 A | 1/1998 |
| JP | 11-204507 | 7/1999 |
| JP | 2000-156366 | 6/2000 |
| JP | 2000104184 | 11/2000 |
| WO | WO 98/49719 | 11/1998 |

OTHER PUBLICATIONS

Williams, K., BSAC Etch Rates for Micromachining and IC Processing, U.C. Berkeley Microfabrication Lab., Berkeley Sensor & Actuator Center, http://www-bsac.eecs.berkeley,edu/db/etchrates.html, no date notated.

Williams, K., VLSI Etchants, Chapter 1.5, Rev. Nov. 1997, http://microlab.berkeley,edu/labmanual/chap1/1.5.html.

Wolf, Stanley, "Silicon Processing for the VLSI Era," cover pages and pp. 194-195, vol. 2: Process Integration, (1990).

* cited by examiner

ETCHANT WITH SELECTIVITY FOR DOPED SILICON DIOXIDE OVER UNDOPED SILICON DIOXIDE AND SILICON NITRIDE, PROCESSES WHICH EMPLOY THE ETCHANT, AND STRUCTURES FORMED THEREBY

CROSS-REFERENCE TO RELATED APPLICATIONS

This application is a continuation of application Ser. No. 09/625,144, filed Jul. 25, 2000, now U.S. Pat. No. 6,537,922, issued Mar. 25, 2003, which is a continuation of application Ser. No. 09/102,152, filed Jun. 22, 1998, now U.S. Pat. No. 6,117,791, issued Sep. 12, 2000.

BACKGROUND OF THE INVENTION

1. Field of the Invention

The present invention relates to processes for selectively etching doped silicon dioxide that overlies silicon nitride or undoped silicon dioxide. Particularly, the process of the present invention includes an etchant mixture which includes the use of an ethane gas having the general formula $C_2H_xF_y$, where x is an integer from two to five, inclusive, y is an integer from one to four, inclusive, and x plus y equals 6. The present invention also relates to etchant mixtures which include a component having the general formula $C_2H_xF_y$, where x is an integer from two to five, inclusive, y is an integer from one to four, inclusive, and x plus y equals 6.

2. State of the Art

The fabrication of multi-layered structures upon semiconductor devices typically involves the patterning of doped silicon dioxide layers, including, without limitation, layers of phosphosilicate glass (PSG), borosilicate glass (BSG) and borophosphosilicate glass (BPSG). Such materials are typically employed as passivation layers on semiconductor devices. Etching techniques are typically employed to pattern many types of semiconductor device structures, including the formation of contacts through passivation layers. Etch stop layers are typically formed on underlying structures in order to terminate the etch process once the desired patterning of the passivation layer, or etch substrate, has occurred. Silicon nitride ($Si_3N_4$) is typically utilized as an etch stop during the patterning of silicon dioxide.

Typically, etching techniques include the depositing, masking and patterning of protective layers, such as photoresists, which act as templates, or protective masks, in order to define structures from a passivation layer by etching techniques. Wet etch or dry etch techniques may be employed to define semiconductor device structures from doped silicon dioxide passivation layers.

An exemplary wet etch process is disclosed in U.S. Pat. No. 5,300,463 (the "'463 patent"), issued to David A. Cathey et al. The wet etch process of the '463 patent, which employs hydrofluoric acid (HF) as an etchant, is selective for doped silicon dioxide over undoped silicon dioxide. Despite its specificity, that technique is somewhat undesirable from the standpoint that it suffers from many of the shortcomings that are typically associated with wet etch processes. Specifically, the technique of the '463 patent is an isotropic etch. Consequently, the structures defined thereby have different dimensions than those of the target area of the etch substrate that is exposed through the protective mask. Moreover, as those of skill in the art are aware, since wet etch techniques are typically isotropic, if the thickness of the film being etched is approximately equivalent to the minimum desired pattern dimension, the undercutting that is typically caused by isotropic etching becomes intolerable. Similarly, with the ever-decreasing size of structures that are carried on the active surfaces of semiconductor devices, etching must be very accurate and maintained within very precise tolerances in order to preserve the alignment of such minute structures and to optimize the electrical characteristics of such structures. Such precision cannot be obtained while defining structures on semiconductor devices with many conventional wet etch processes. Thus, the lack of precision and isotropic nature of typical wet etching processes are inconsistent with the overall goal of etch processes in forming structures on state-of-the-art semiconductor devices: reproducing the features defined by the protective mask with a high degree of fidelity.

In contrast, many dry etch techniques including, without limitation, glow-discharge sputtering, ion milling, reactive ion etching (RIF), reactive ion beam etching (RIBE) and high-density plasma etching, are capable of etching in a substantially anisotropic fashion, meaning that the target area of an etch substrate is etched primarily in a substantially vertical direction relative to the exposed, or active, surface of the etch substrate. Thus, such dry etch techniques are capable of defining structures with substantially upright sidewalls from the etch substrate. Consequently, such dry etch techniques are capable of accurately reproducing the features of a protective mask. Thus, due to ever-decreasing dimensions of structures on semiconductor devices, dry etching is often desirable for defining structures upon semiconductor device active surfaces.

Many techniques that employ plasmas to dry etch silicon dioxide layers, however, lack the specificity of comparable wet etch techniques since fluorocarbons, such as $CF_4$ and $CHF_3$, are typically employed in plasma dry etches of silicon dioxide layers. The radio-frequency (RF) plasmas that are typically utilized with many silicon dioxide dry etch processes generate activated species, such as fluoride ions and fluorine free radicals, from such fluorocarbon etchants. While these activated species attack the silicon dioxide layer in order to etch the same, the activated fluorine radicals and fluoride ions of many dry etch techniques may also attack other materials, such as silicon and silicon nitride. Consequently, in addition to etching the desired layer, many dry etch techniques that employ plasmas also undesirably etch the etch stop layers and other structures of the semiconductor device that are exposed or which become exposed during the etching process.

Etch stop materials employed in dry etch techniques are typically etched at a lower rate than the associated, usually underlying, etch substrate. Since the dry etchant etches the etch stop layer at a slower rate than the outer layer, the etch stop layer acts to protect structures therebeneath from the dry etch process, even as the etch stop itself is being consumed.

Since the gate structures of many semiconductor devices include a silicon nitride ($Si_3N_4$) cap, selectivity between silicon dioxide ($SiO_2$) and silicon nitride is desirable in order to etch contacts through passivation layers. Many of the so-called silicon dioxide-selective plasma dry etch techniques, however, have a $SiO_2$ to $Si_3N_4$ selectivity ratio, or etch rate of $SiO_2$ to etch rate of $Si_3N_4$, of less than about 3:1.

U.S. Pat. No. 5,286,344 (the "'344 patent"), issued to Guy Blalock et al. on Feb. 15, 1994, discloses a dry etch process which has much better selectivity for silicon dioxide over silicon nitride than many other conventional silicon dioxide dry etch techniques. Specifically, $CH_2F_2$, which is employed as an additive to a primary etchant such as $CF_4$ or $CEF_3$, imparts the dry etchant mixture with improved selectivity for silicon dioxide over silicon nitride. The high energy ions that are required to etch both silicon dioxide and silicon nitride act by dissociating a chemical bond at the respective oxide or nitride surface. The dissociation energy that is required to etch silicon nitride, however, is less than that required to etch silicon dioxide. The use of $CH_2F_2$ in the dry etchant causes polymer deposition on the silicon nitride surface that offsets the dissociation properties of silicon nitride relative to silicon dioxide relative to conventional dry etchants which lack additives such as $CH_2F_2$. Thus, the etchant of the '344 patent etches silicon dioxide over an etch stop of silicon nitride with a selectivity of greater than 30:1. As with other conventional silicon dioxide dry etch techniques, however, the only material that is disclosed as a useful etch stop in the '344 patent is silicon nitride. Thus, the utility of the dry etch process that is disclosed in the '344 patent is limited to defining semiconductor device structures which include a silicon nitride dielectric layer, such as, for example, contacts over silicon nitride-capped gates. Moreover, the relative flow rates of each of the dry etchant components disclosed in the '344 patent are limited to narrow ranges in order to achieve the desired level of selectivity. Similarly, many other conventional dry etch processes require the use of very specific dry etchant components. Thus, the process windows of many conventional dry etch systems are narrow.

Although silicon nitride is widely employed as an etch stop material, the use of silicon nitride etch stops is, however, somewhat undesirable from the standpoint that the deposition of silicon nitride upon a semiconductor device active surface by low pressure chemical vapor deposition (LPCVD) processes may also form a thick nitride layer on the back surface of the semiconductor device. Such thick nitride layers must be subsequently removed, which increases fabrication time and costs, as well as the potential for damaging the semiconductor device during the fabrication thereof.

Moreover, the fluorine radicals and fluoride ions that are generated by conventional dry etches which employ plasmas non-selectively attack, or etch, both doped and undoped silicon dioxide. Thus, such silicon dioxide dry etch techniques are incapable of distinguishing between doped and undoped silicon dioxide. Consequently, when conventional dry etch techniques are employed, the use of alternatives to silicon nitride in state-of-the-art semiconductor devices is restricted.

Accordingly, the inventors have recognized a need for a selective doped silicon dioxide dry etch process for which both silicon nitride and undoped silicon dioxide act as etch stops, and etchants which are specific for silicon dioxide over both undoped silicon dioxide and silicon nitride. Etchant mixtures are also needed wherein relative concentrations of each of the components of such etchant mixtures may be varied in order to facilitate the use of such mixtures in a broad range of doped silicon dioxide etching applications.

BRIEF SUMMARY OF THE INVENTION

The present invention includes a dry etch process and etchants that address the foregoing needs and overcome the disadvantages manifested by conventional dry etch processes.

The etchants of the present invention include $C_2H_xF_y$, where x is an integer from two to five, inclusive, y is an integer from one to four, inclusive, and x plus y equals 6. Specifically, the $C_2H_xF_y$ component of the present invention may be selected from the group consisting of $C_2H_2F_4$, $C_2H_3F_3$, $C_2H_4F_2$, and $C_2H_5F$. The $C_2H_xF_y$ component may be used as either a primary etchant or as a component of an etchant mixture. When employed as a primary etchant, $C_2H_xF_y$ etches doped silicon dioxide at a slow rate relative to the etch rates of many conventional silicon dioxide dry etch techniques, but selectively etches doped silicon dioxide over undoped silicon dioxide.

When used as an additive to other silicon dioxide etchants, $C_2H_xF_y$ imparts the etchant mixture with selectivity for doped silicon dioxide over undoped silicon dioxide, while permitting the doped silicon dioxide etch to proceed at a comparable rate relative to many conventional doped silicon dioxide dry etch techniques. The amount of $C_2H_xF_y$ used in the etchant mixture may be varied, depending upon the particular species of $C_2H_xF_y$ used, the desired level of doped to undoped silicon dioxide selectivity (i.e., selectivity ratio), the desired level of silicon dioxide to silicon nitride selectivity, the desired etch rate, and other factors.

The dry etch process of the present invention employs an etchant of the present invention (i.e., an etchant which includes $C_2H_xF_y$), and is selective for doped silicon dioxide over both undoped silicon dioxide and silicon nitride. Thus, the dry etch process of the present invention may be effectively employed for anisotropically etching a doped silicon dioxide layer down to an underlying etch stop of either undoped silicon dioxide or silicon nitride.

Other advantages of the present invention will become apparent to those of ordinary skill in the relevant art through a consideration of the appended drawings and the ensuing description.

DETAILED DESCRIPTION OF THE INVENTION

Figure 1:
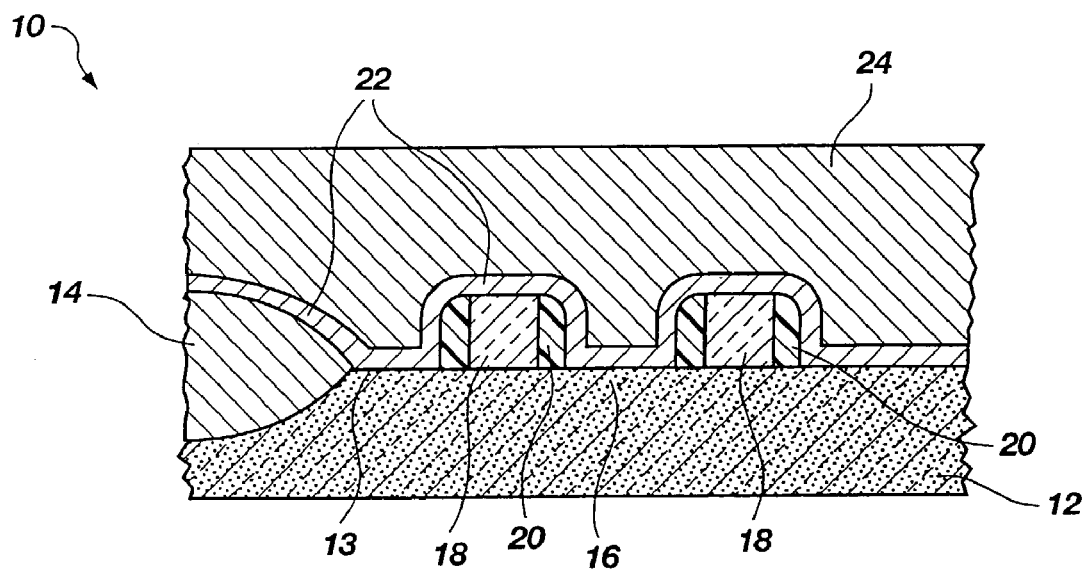
FIGS. 1 through 4 are cross-sectional schematic representations which illustrate the process of the present invention and exemplary structures that may be formed thereby.

The present invention includes an etchant that is selective for doped silicon dioxide over both undoped silicon dioxide and silicon nitride. As those of skill in the art are aware, "doped" silicon dioxide typically includes a dopant such as boron or phosphorus, whereas undoped silicon dioxide is substantially free of dopants and other impurities. Exemplary types of doped silicon dioxide include, without limitation, borosilicate glass (BSG), phosphosilicate glass (PSG) and borophosphosilicate glass (BPSG). The present invention also includes a dry etch process which utilizes the inventive etchant.

The doped silicon dioxide etchant of the present invention, which is also merely referred to as an etchant for simplicity, includes an ethane component of the general formula $C_2H_xF_y$, which is also referred to as the $C_2H_xF_y$ component or $C_2H_xF_y$ for simplicity, where x is an integer from two to five, inclusive, y is an integer from one to four, inclusive, and x plus y equals 6. Specifically, the $C_2H_xF_y$ component of the present invention is desirably selected from the group consisting of $C_2H_2F_4$, $C_2H_3F_3$, $C_2H_4F_2$, and $C_2H_5F$. The doped silicon dioxide etchant may also include combinations of various types of $C_2H_xF_y$.

As the $C_2H_xF_y$ component of a doped silicon dioxide etchant is RF activated, the hydrogen ions and activated hydrogen species react with the fluorine-containing ions and activated fluorine-containing species (e.g., F* and CF*), removing the activated fluorine-containing species from the surface of the wafer prior to the occurrence of any substantial amount of etching of an etch stop layer of either undoped silicon dioxide or silicon nitride. The hydrogen content of the $C_2H_xF_y$ additives imparts etchants including the same with specificity for doped silicon dioxide over undoped silicon dioxide.

In a first embodiment of the doped silicon dioxide etchant of the present invention, $C_2H_xF_y$ is a primary etchant. When used as the primary etchant, $C_2H_xF_y$ is selective for doped silicon dioxide over undoped silicon dioxide. Stated another way, $C_2H_xF_y$ etches doped silicon dioxide at a higher rate than it etches undoped silicon dioxide. As the primary etchant, $C_2H_xF_y$ etches doped silicon dioxide at a relatively slow rate compared to the etch rates of many conventional silicon dioxide dry etchants. Thus, additives which will increase the etch rate may be used in combination with $C_2H_xF_y$. Such additives include, but are not limited to, $CF_4$, $CHF_3$, and other halogenated carbon materials which have been used as primary etchants in conventional doped silicon dioxide dry etch techniques.

Similarly, additives that increase an etchant's selectivity for silicon dioxide over silicon nitride (i.e., reduce the rate at which silicon nitride is etched) may also be used as additives to etchants which include $C_2H_xF_y$ as the primary etchant. U.S. Pat. No. 5,286,344 (the "'344 patent"), issued to Guy Blalock et al. on Feb. 15, 1994, the disclosure of which is hereby incorporated by reference in its entirety, discloses some exemplary additives that may enhance the selectivity of $C_2H_xF_y$ in this manner. The additives of the '344 patent are fluorocarbons in which the number of hydrogen atoms is equal to or greater than the number of fluorine atoms, such as $CH_2F_2$ and $CH_3F$.

Other additives may also be used with silicon dioxide etchants that include $C_2H_xF_y$ as the primary etchant in order to alter other characteristics of such etchants, including, without limitation, the selectivity of such etchants for doped silicon dioxide over undoped silicon dioxide and the selectivity for certain types of doped silicon dioxide over other types of doped silicon dioxide.

In another embodiment of the doped silicon dioxide etchant of the present invention, $C_2H_xF_y$ is employed as an additive to one or more primary etchants. $C_2H_xF_y$ may be used as an additive to etchants which include a fluorocarbon primary etchant, such as $CF_4$, $CEF_3$, or other fluorocarbons which etch silicon dioxide at a higher rate than they etch silicon nitride (i.e., are selective for silicon dioxide over silicon nitride). According to the '344 patent, $CF_4$ and $CEF_3$ are exemplary primary etchants with which $C_2H_xF_y$ may be utilized as an additive.

When used as an additive to a silicon dioxide etchant, such as $CF_4$ or $CHF_3$, $C_2H_xF_y$ imparts the silicon dioxide etchant with selectivity for doped silicon dioxide over undoped silicon dioxide while permitting the doped silicon dioxide etch to proceed at a substantially normal rate. The amount of $C_2H_xF_y$ that is used in an etchant mixture, relative to the amounts of other etchants and any carrier gas, may be varied in order to tailor the characteristics thereof and to achieve the desired etching results. The various characteristics of the etchant mixture which may be varied by altering the concentration of $C_2H_xF_y$ in the mixture include, but are not limited to, selectivity for doped silicon dioxide over undoped silicon dioxide, selectivity for silicon dioxide over silicon nitride, and the doped silicon dioxide etch rate.

An exemplary dry etchant that is selective for doped silicon dioxide over both undoped silicon dioxide and silicon nitride includes about 40% of the additive $C_2H_2F_4$ (i.e., the $C_2H_xF_y$ component), about 30% of the primary etchant $CHF_3$, and about 30% of $CH_2F_2$, an additive which improves the selectivity of the primary etchants for silicon dioxide over silicon nitride, each of the percentages based on the relative flow rates of each gas into the etcher.

Alternatively, the amounts of the $C_2H_xF_y$ component may be varied considerably. Etchants which include any amount of an additive of the general formula $C_2H_xF_y$, where x is an integer from two to five, inclusive, where y is an integer from one to four, inclusive, and where x plus y equals six, are within the scope of the present invention. Exemplary etchants may include five percent, ten percent, twenty percent, sixty-five percent, or ninety percent of the $C_2H_xF_y$ additive or any combination of $C_2H_xF_y$ additives.

Similarly, it is also foreseen that $C_2H_xF_y$ may be employed as an additive to silicon dioxide dry etchants which include other components. For example, $C_2H_xF_y$ could be used along with an etchant which includes either $CF_4$ or $CHF_3$ or both of them as primary etchants and a carrier gas, such as argon or nitrogen. Alternatively, the $C_2H_xF_y$-containing dry etchant may include one or more other additives that alter the various characteristics of the dry etchant, such as the etch rate, the degree of selectivity, and the type of selectivity. For example, as disclosed in the '344 patent, the use of $CH_2F_2$ as an additive enhances the selectivity of the dry etchant for silicon dioxide over silicon nitride. Combinations of the additives of the general formula $C_2H_xF_y$ may also be employed as components in a doped silicon dioxide dry etchant.

A preferred embodiment of the dry etch process of the present invention employs an etchant of the present invention (i.e., an etchant which includes $C_2H_xF_y$), and is selective for doped silicon dioxide over both undoped silicon dioxide and silicon nitride. Thus, the dry etch process includes the etching of a doped silicon dioxide layer down to an etch stop of either undoped silicon dioxide or silicon nitride.

Referring to FIGS. 1 to 4, the etch process of the present invention, which utilizes the inventive etchant, is illustrated. FIG. 1 depicts an exemplary multi-layer structure 10, which is also referred to as a semiconductor device structure, that may be fabricated in part in accordance with the process of the present invention. Multi-layer structure 10 includes a semiconductor substrate 12 (e.g., a silicon wafer, silicon-on-insulator (SOI), silicon-on-sapphire (SOS), silicon-on-glass (SOG), etc.), a field oxide layer 14 that is disposed on an active surface 13 of the semiconductor substrate and an active device region 16, polysilicon lines 18 disposed on the active device region, side wall spacers 20 positioned on each side of the polysilicon lines, an intermediate structural layer 22 disposed over each of the foregoing elements, and a passivation layer 24 disposed over the intermediate structural layer 22. Passivation layer 24 is fabricated from doped silicon dioxide, such as BPSG, PSG or BSG. Intermediate structural layer 22 may be fabricated from either silicon nitride or undoped silicon dioxide.

Figure 2:
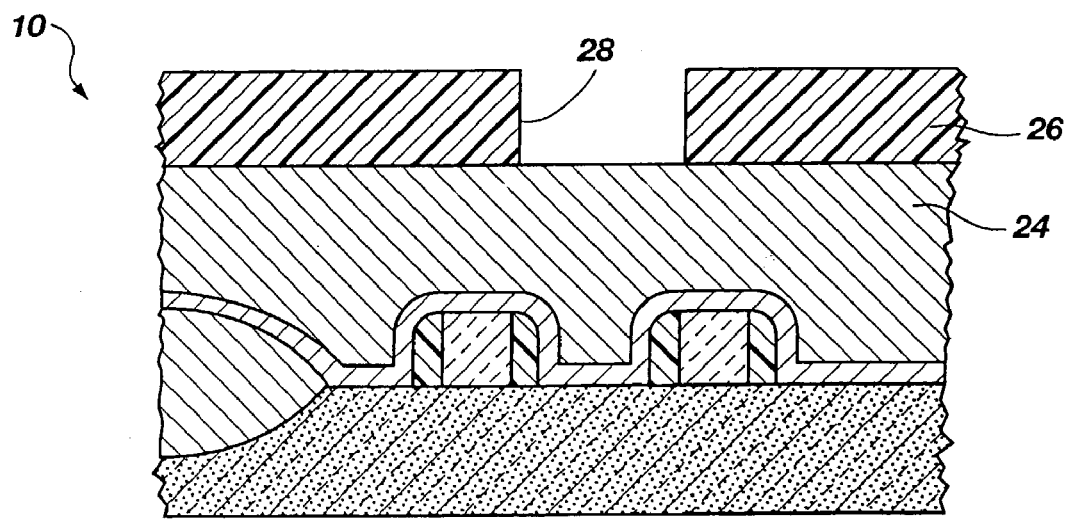

FIG. 2 depicts masking of multi-layer structure 10 prior to defining a structure through passivation layer 24. A mask 26, which is also referred to as a protective layer, is layered and patterned over passivation layer 24. Mask 26 may be formed from a material such as a photoresist, or photoimageable material. Exemplary positive photoresists that are useful as mask 26 may include a novolac resin, a diazonaphthaquinone, and a solvent, such as n-butyl acetate or xylene. Exemplary negative photoresists that are useful as mask 26 may include a cyclized synthetic rubber resin, bis-arylazide, and an aromatic solvent. Such a mask 26 may be applied to, or coated onto, multi-layer structure 10 and patterned by techniques that are known to those in the art, such as spin coating and photomask processing and patterning techniques. Alternatively, mask 26 may comprise an aerosol spray pattern of electrostatically chargeable hardenable liquid material, such as a polymer, which is not etched or is etched at a much slower rate than the underlying passivation layer 24. An exemplary method for spray-patterning such electrostatically chargeable hardenable liquid materials is described in U.S. Pat. No. 5,695,658 (the "'658 patent"), which issued to James J. Alwan on Dec. 9, 1997, the disclosure of which is hereby incorporated by reference. Both photoresist materials (positive and negative) and non-photoimageable materials may be employed as mask 26 in accordance with the '658 patent. The utilization of masks 26 which comprise other non-photoimageable materials and the processes for applying and patterning them are also within the scope of the method of the present invention. The patterning of mask 26 defines openings 28, which are also referred to as apertures or contact apertures, therethrough, through which predetermined structures will be defined in the underlying passivation layer 24 during a subsequent etch step. Mask 26 comprises a material that is resistant to the etchant of the present invention (i.e., the etchant does not etch mask 26 or etches the mask at a relatively slow rate compared to the rate at which the etch substrate is etched). Thus, the areas of passivation layer 24 which underlie mask 26 are protected from the etchant during the subsequent etch step.

Figure 3:
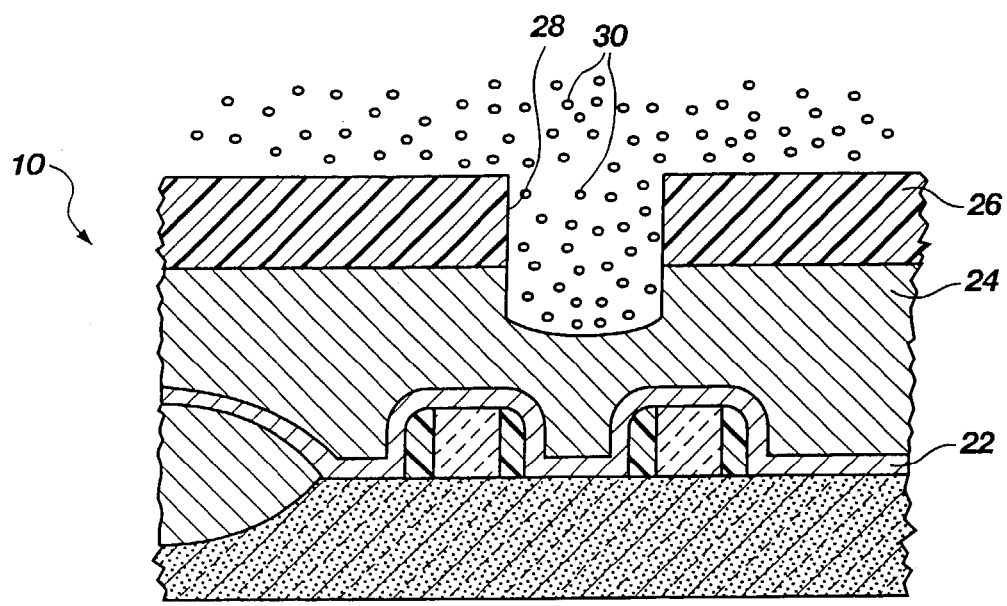

Turning now to FIG. 3, an etch step is depicted, wherein an etchant 30, which is introduced into an etch chamber (not shown) either with or without a carrier gas, attacks the areas of passivation layer 24 that are exposed through openings 28 of mask 26. Dry etch processes that are known to those of skill in the art, including, without limitation, high density plasma etching, reactive ion etching (RIE), magnetic ion etching (MIE), magnetically enhanced reactive ion etching (MERIE), plasma etching (PE), point plasma etching, plasma enhanced reactive ion etching (PERIE), and electron cyclotron resonance (ECR), may be employed with the etchant of the present invention and are within the scope of the process of the present invention. Etchant 30, which comprises a $C_2H_xF_y$-containing etchant of the present invention, etches an aperture through passivation layer 24 in a substantially vertical fashion until intermediate structural layer 22 is exposed. Intermediate structural layer 22, which is fabricated from either undoped silicon dioxide or silicon nitride, acts as an etch stop layer. Thus, etchant 30 etches intermediate structural layer 22 at a slower rate than the rate at which passivation layer 24 is etched. After the exposed areas of passivation layer 24 have been etched, mask 26 may be removed by processes that are known in the art, such as washing or etching techniques.

Figure 4:
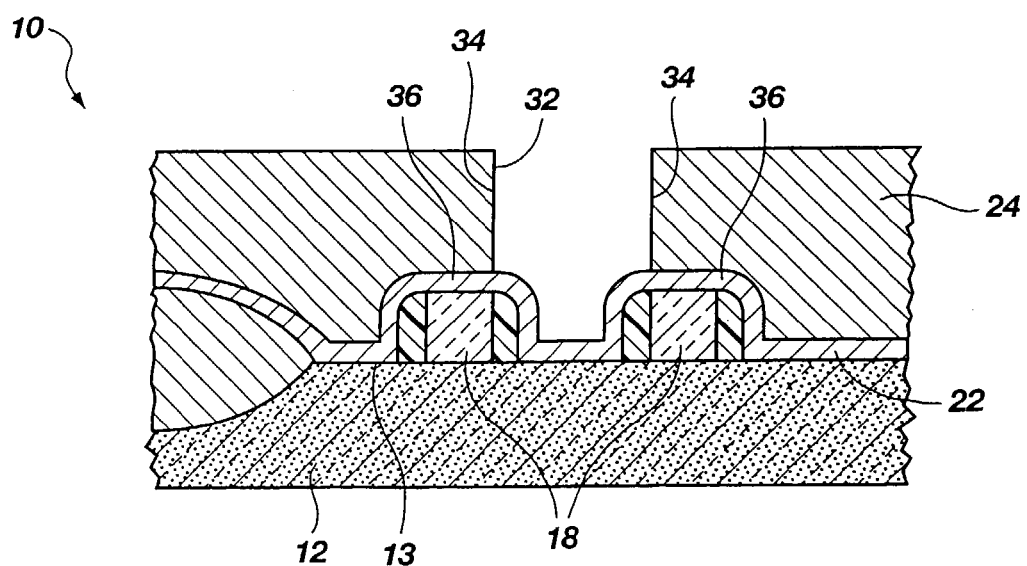

FIG. 4 illustrates a contact opening 32, which is also referred to as a contact, that has been formed through passivation layer 24 by the etch process of the present invention. Contact opening 32 includes side walls 34 that are substantially vertical relative to active surface 13 of semiconductor substrate 12. Contact openings 32 of the multi-layer structure 10 expose at least a portion of the intermediate structural layer 22 that lies above each of polysilicon lines 18, which may be logic circuits, such as word lines. Intermediate structural layer 22 defines a cap 36 over each polysilicon line 18. Thus, cap 36 may be fabricated from either undoped silicon dioxide or silicon nitride.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced within their scope.

What is claimed is:

1. A selective dry etch process, comprising:
    exposing a structure comprising doped silicon dioxide to an etchant comprising $C_2F_xF_y$, where x is an integer from 3 to 5, inclusive, y is an integer from 1 to 3, inclusive, and x+y=6; and
    removing the structure down to another, adjacent structure that comprises undoped silicon dioxide, removing being effected without substantially removing the another adjacent structure.

2. The process of claim 1, further comprising:
    forming a protective structure over the structure so as to protect at least selected regions of the structure.

3. The process of claim 2, further comprising:
    patterning the protective structure so as to expose the selected regions of the structure.

4. The process of claim 2, wherein forming the protective structure comprises forming a protective structure comprising a photoimageable material.

5. The process of claim 4, further comprising:
    employing photolithography techniques to pattern the protective structure.

6. The process of claim 2, wherein forming the protective structure comprises forming the protective structure from a non-photoimageable material.

7. The process of claim 1, wherein removing is effected by reactive ion etching, plasma etching, high density plasma etching, point plasma etching, magnetic ion etching, magnetically enhanced reactive ion etching, plasma enhanced reactive ion etching, or electron cyclotron resonance.

8. A method for using a structure comprising undoped silicon dioxide as an etch stop in a doped silicon dioxide dry etch process, comprising exposing a structure comprising doped silicon dioxide to an etchant comprising at least $C_2H_xF_y$, where x is an integer from 3 to 5, inclusive, y is an integer from 1 to 3, inclusive, and x+y=6.

9. A process for fabricating a semiconductor device structure, comprising:
    forming a layer or structure comprising doped silicon dioxide over another layer or structure comprising undoped silicon dioxide; and
    exposing regions of the layer or structure and regions of the another layer or structure to an etchant comprising $C_2H_xF_y$, where x is an integer from 3 to 5, inclusive, y is an integer from 1 to 3, inclusive, and x+y=6, with material of the layer or structure being etched by the etchant while material of the another layer or structure is not substantially etched by the etchant.

10. The process of claim 9, wherein exposing is effected through a mask.

11. The process of claim 9, wherein exposing comprises removing material of the layer or structure with selectivity over material of the another layer or structure.

12. A process for fabricating a semiconductor device structure, comprising:

forming a layer or structure comprising doped silicon dioxide over another layer or structure comprising undoped silicon dioxide; and exposing regions of the layer or structure and regions of the another layer or structure to an etchant comprising $C_2H_xF_y$, where x is an integer from 3 to 5, inclusive, y is an integer from 1 to 3, inclusive, and x+y=6, with material of the layer or structure being removed without substantially removing material of the another layer or structure.

13. The process of claim 12, wherein exposing is effected through a mask.

* * * * *